(12) United States Patent
Choi

(10) Patent No.: US 7,435,677 B2
(45) Date of Patent: Oct. 14, 2008

(54) METHOD FOR FABRICATING SEMICONDUCTOR DEVICE

(75) Inventor: Dong-Goo Choi, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 42 days.

(21) Appl. No.: 11/595,440

(22) Filed: Nov. 9, 2006

(65) Prior Publication Data
US 2007/0254473 A1  Nov. 1, 2007

(30) Foreign Application Priority Data
Apr. 28, 2006 (KR) ............... 10-2006-0038995

(51) Int. Cl.
*H01L 21/4763* (2006.01)
(52) U.S. Cl. ............. 438/637; 438/254; 438/597; 438/672; 257/E21.257; 257/E21.577
(58) Field of Classification Search ......... 438/637, 438/597, 254, 672; 257/E21.257, E21.577
See application file for complete search history.

(56) References Cited

U.S. PATENT DOCUMENTS 5,478,772 A * 12/1995 Fazan ............... 438/396
5,506,166 A * 4/1996 Sandhu et al. ........ 438/396
6,136,643 A * 10/2000 Jeng et al. ........... 438/253
6,943,081 B2 * 9/2005 Lee et al. ............ 438/256

FOREIGN PATENT DOCUMENTS

| KR | 2003-0006893 | 1/2003 |
|---|---|---|
| KR | 2003-0039236 | 5/2003 |
| KR | 10-2006-0000022 | 1/2006 |

\* cited by examiner

*Primary Examiner*—Andy Huynh
(74) *Attorney, Agent, or Firm*—Blakely, Sokoloff, Taylor & Zafman

(57) ABSTRACT

A method for fabricating a semiconductor device includes: forming a first inter-layer insulation layer over a substrate where a plurality of first contact holes are formed; forming a conductive layer over the first inter-layer insulation layer to fill the first contact holes; etching the conductive layer such that a surface of the first inter-layer insulation layer is higher than that of the conductive layer, whereby a plurality of contact plugs filling the first contact holes are formed; and forming an etch stop layer more thickly over the surfaces of the contact plugs than the surface of the first inter-layer insulation layer.

18 Claims, 7 Drawing Sheets

METHOD FOR FABRICATING SEMICONDUCTOR DEVICE

FIELD OF THE INVENTION

The present invention relates to a method for fabricating a semiconductor device; and more particularly, to a method for fabricating a capacitor having a capacitor over bit line (COB) structure in a dynamic random access memory (DRAM) device.

DESCRIPTION OF RELATED ARTS

A dynamic random access memory (DRAM) device which has a high capacitance and can freely input and output data, has been widely used as a semiconductor memory device. The DRAM device includes a memory cell region for storing the data in a type of electric charges and a peripheral circuit region for inputting and outputting the data. The memory cell region is comprised of a plurality of unit cells, and each of the unit cells includes an access transistor and a storage capacitor.

Recently, as the integration scale of the semiconductor device has been increased, a size of each unit cell has been decreased and as a result, a size of the capacitor has been decreased as well. Accordingly, efforts to fabricate the capacitor having a high storing capacitance with a decreased size have become very important. As a part of the efforts, a technology improving the storing capacitance of the capacitor without increasing a horizontal area in which the capacitor takes place has been developed.

For instance, a capacitor under bit line (CUB) structure which the capacitor is formed before a bit line is formed is changed to a capacitor over bit line (COB) structure in which the capacitor is formed after a bit line is formed. In contrast to the CUB structure, since the COB structure forms the capacitor after the bit line is formed, the capacitor can be formed regardless of a bit line process margin. Accordingly, the COB structure provides an advantage in increasing the storing capacitance of the capacitor within a limited area.

FIGS. 1A to 1C are cross-sectional views illustrating a method for fabricating a capacitor with a typical capacitor over bit line (COB) structure.

As shown in FIG. 1A, a plurality of field oxide layers 11 are formed in a substrate 10 to isolate devices and then, a first inter-layer insulation layer 12 is formed over the substrate 10. Before the formation of the first inter-layer insulation layer 12, transistors including word lines (not shown) are formed as is well known.

A plurality of landing plugs 13 are formed in the first inter-layer insulation layer 12. Afterwards, a plurality of bit lines 15 are formed over upper portions of the first inter-layer insulation layer 12 including the landing plugs 13. Each of the bit lines 15 is formed by sequentially stacking a bit line conductive layer 14 and a bit line hard mask 15. A plurality of bit line spacers 18 are formed over sidewalls of the bit lines 17.

A second inter-layer insulation layer 19 is formed over the above resulting structure until sufficiently filling empty spaces between the bit lines 17. Afterwards, the second inter-layer insulation layer 19 is selectively etched to form a plurality of storage node contact holes (not shown) exposing surfaces of the landing plugs 13 between the bit lines 17.

The storage node contact holes are filled with a conductive layer and then, an etch back process is performed until a surface of the second inter-layer insulation layer 19 that has been etched is exposed. As a result, a plurality of storage node contact plugs 20 are filled in the storage node contact holes.

The etch back process is performed with etch selectivity of approximately 1 part of the inter-layer insulation layer material to approximately 1 part of the storage node contact plug material. Due to the etch back process, a planarization of the storage node contact plugs 20 can be achieved without causing a height difference between top surfaces of the storage node contact plugs 20 and a top surface of the second inter-layer insulation layer 19 that has been etched.

As shown in FIG. 1B, an etch stop layer 21 and a third inter-layer insulation layer 22 are sequentially formed over the second inter-layer insulation layer 19 that has been etched and the storage node contact plugs 20. The etch stop layer 21 includes a nitride-based material. Then, a separate hard mask pattern 23 is formed over the third inter-layer insulation layer 22. The hard mask pattern 23 typically includes a nitride-based layer or polysilicon. Herein, the hard mask pattern 23 includes the same material as the storage node contact plugs 20, e.g., polysilicon.

An etching process is performed using the hard mask pattern 23 to etch predetermined portions of the third inter-layer insulation layer 22. The etching process is stopped at an upper portion of the etch stop layer 21.

As shown in FIG. 1C, a separate etching process is performed to remove the hard mask pattern 23 (see FIG. 1B). During the etching process performed to remove the hard mask pattern 23, since a thickness of the etch stop layer 21 over the storage node contact plugs 20 is very small, a predetermined portion of the etch stop layer 21 over the storage node contact plugs 20 may be removed simultaneous to the removal of the hard mask pattern 23. As a result, surfaces of the storage node contact plugs 20 may be exposed, and the exposed portion of the storage node contact plugs 20 may be damaged as denoted with reference letter 'A'.

Since the hard mask pattern 23 includes the same material as the storage node contact plugs 20, the storage node contact plugs 20 may also be easily removed while the hard mask pattern 23 is removed. Accordingly, the surfaces of the storage node contact plugs 20 may be easily damaged. The damaged portion denoted with the reference letter 'A' on the surfaces of the storage node contact plugs 20 may induce a deposition defect during forming a bottom electrode of a capacitor and a dielectric layer to be subsequently formed. Accordingly, the deposition defect may decrease yields of products due to degradation in a capacitor property and an electric short circuit between the bit lines 17.

FIG. 2 is a transmission electron microscopy (TEM) micrograph illustrating typical storage node contact plugs planarized as shown in FIG. 1A.

SUMMARY OF THE INVENTION

It is, therefore, an object of the present invention to provide a method for fabricating a semiconductor device capable of reducing damage on a surface of a storage node contact plug during removing a hard mask pattern used in etching an inter-layer insulation layer for a storage node, thereby improving an operation property of a device.

In accordance with one aspect of the present invention, there is provided a method for fabricating a semiconductor device, including: forming a first inter-layer insulation layer over a substrate where a plurality of first contact holes are formed; forming a conductive layer over the first inter-layer insulation layer to fill the first contact holes; etching the conductive layer such that a surface of the first inter-layer insulation layer is higher than that of the conductive layer, whereby a plurality of contact plugs filling the first contact holes are formed; and forming an etch stop layer more thickly over the surfaces of the contact plugs than the surface of the first inter-layer insulation layer.

In accordance with another aspect of the present invention, there is provided a method for fabricating a semiconductor device, including: providing a substrate where word lines, landing plugs and bit lines are formed; forming a first inter-layer insulation layer to cover the bit lines; etching the first inter-layer insulation layer to expose top surfaces of the landing plugs to form a plurality of first contact holes; forming a conductive layer over the first inter-layer insulation layer to fill the first contact holes; etching the conductive layer such that a top surface of the first inter-layer insulation layer is higher than that of the conductive layer, whereby a plurality of storage node contact plugs filling the first contact holes are formed; forming an etch stop layer with a greater thickness over the first inter-layer insulation layer than over the storage node contact plugs; forming a second inter-layer insulation layer over the etch stop layer; forming a hard mask pattern over the second inter-layer insulation layer; etching the second inter-layer insulation layer through performing an etching process using the hard mask pattern to form a plurality of second contact holes exposing the etch stop layer; removing the hard mask pattern; removing the etch stop layer remaining over the storage node contact plugs to expose the storage node contact plugs; and forming a storage node over a height difference produced by the forming of the second contact holes.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

Figure 1A:
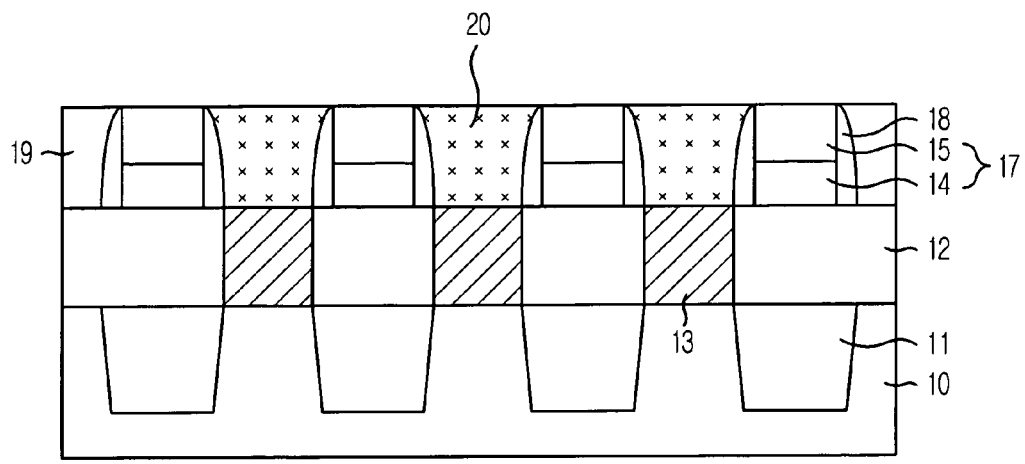
FIGS. 1A to 1C are cross-sectional views illustrating a method for fabricating a capacitor of a typical capacitor over bit line (COB) structure.
Figure 1B:
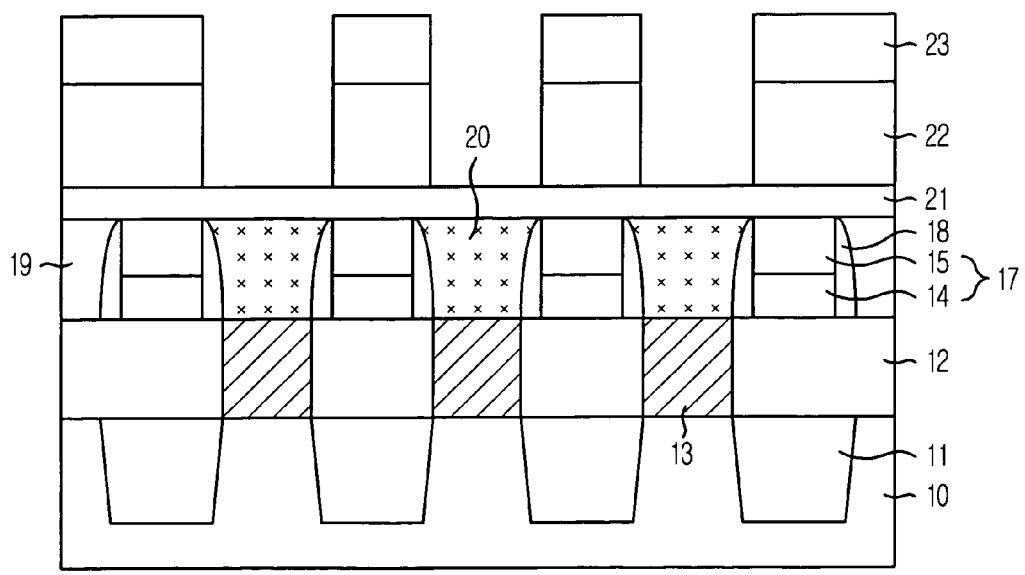
Figure 1C:
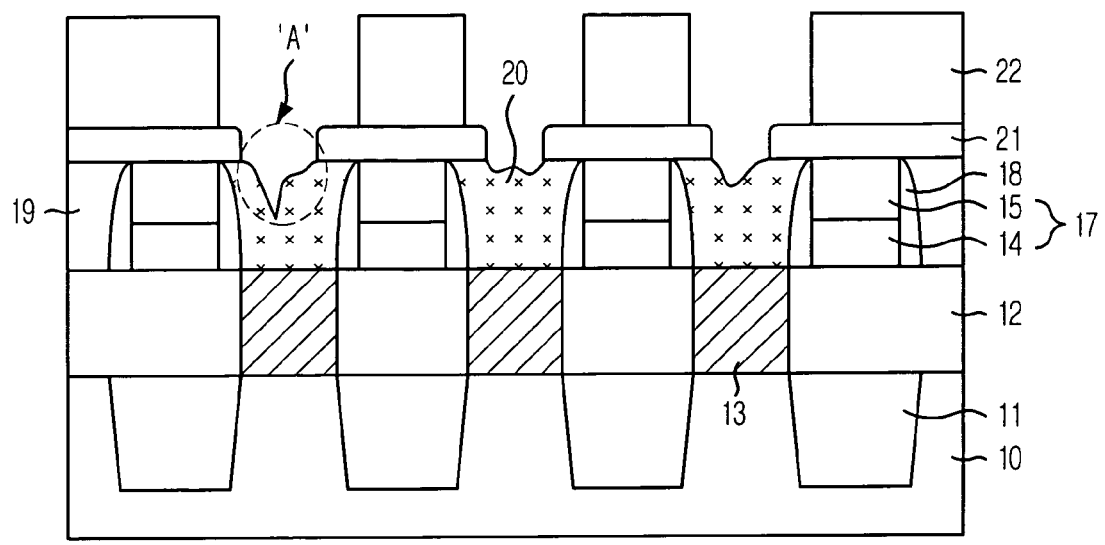
Figure 2:
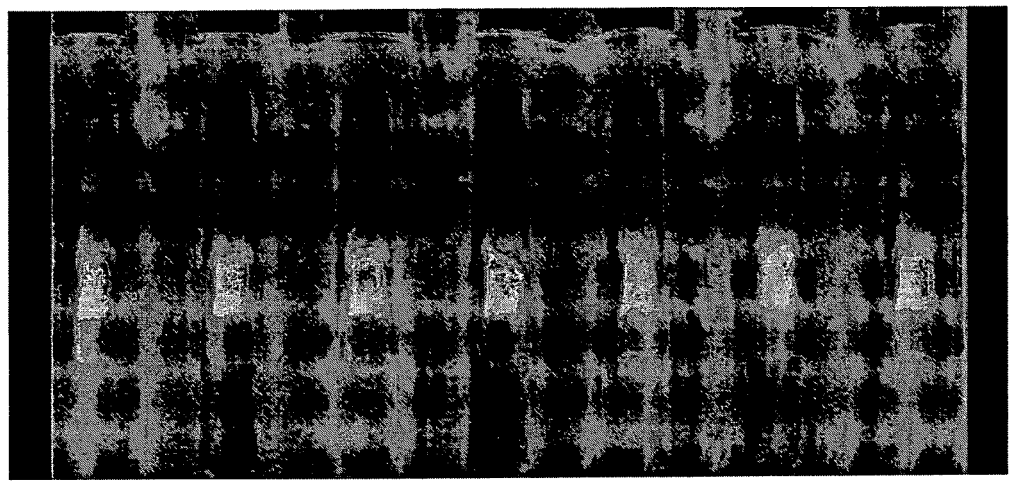
FIG. 2 is a transmission electron microscopy (TEM) micrograph illustrating typical storage node contact plugs planarized as shown in FIG. 1A.

Hereinafter, detailed descriptions on certain embodiments of the present invention will be provided with reference to the accompanying drawings. Herein, the thickness of layers and regions may be magnified in the accompanying drawings to clearly show the layers and the regions. Also, when a layer is described to be formed over a layer or a substrate, either the layer can be directly formed on the other layer or the substrate, or a third layer may be disposed therebetween. Furthermore, the same or like reference numerals denote the same or like elements even in different drawings.

FIGS. 3A to 3F are cross-sectional views illustrating a method for fabricating a capacitor of a semiconductor device in accordance with an embodiment of the present invention. Herein, FIGS. 3A to 3F illustrate the cross-sectional views taken along the direction that a word line is vertically elongated in a cell region where a dynamic random access memory (DRAM) cell is formed.

Figure 3A:
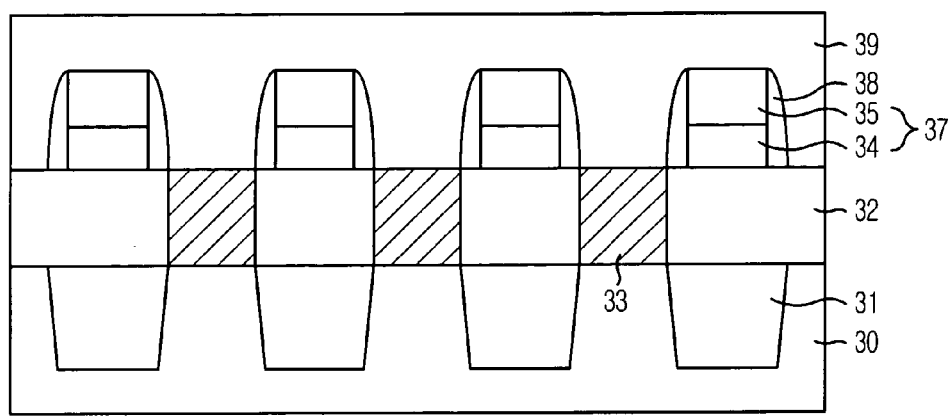
FIGS. 3A to 3F are cross-sectional views illustrating a method for fabricating a capacitor of a semiconductor device in accordance with an embodiment of the present invention.

As shown in FIG. 3A, a well ion-implantation process and an ion-implantation process for controlling a threshold voltage are performed on a substrate 30 to form a plurality of well regions (not shown) in the substrate 30.

A local oxidation of silicon (LOCOS) process and/or a shallow trench isolation (STI) process are employed to isolate the device. As a result, a plurality of field oxide layers 31 are formed in the substrate 30.

A plurality of gate patterns (i.e., word lines), each formed in a stack structure of a gate oxide layer and a polysilicon layer are formed over the substrate 30 and then, a plurality of spacers are formed over sidewalls of the gate patterns. Afterwards, a highly concentrated ion-implantation process is performed to form a plurality of source/drain regions with a predetermined thickness in the substrate 30 exposed in both sides of the gate patterns. As a result, a plurality of transistors forming unit cells are obtained.

A first inter-layer insulation layer 32 is formed to cover the above resulting structure including the transistors. The first inter-layer insulation layer 32 includes an oxide-based material selected from a group consisting of high density plasma (HDP) oxide layer, a borophosphosilicate glass (BPSG) layer, a phosphosilicate glass (PSG) layer, a plasma enhanced tetraethylortho silicate (PETEOS) layer, a plasma enhanced chemical vapor deposition (PECVD) layer, a undoped silicate glass (USG) layer, a fluorinated silicate glass (FSG) layer, a carbon doped oxide (CDO) layer, an organic silicate glass (OSG) layer, and a combination thereof.

Predetermined portions of the first inter-layer insulation layer 32 are etched to form a plurality of contact holes (not shown) in the first inter-layer insulation layer 32. Afterwards, a conductive layer is formed to fill the contact holes and as a result, a plurality of landing plugs 33 are formed.

A plurality of bit lines 37 are formed over the first inter-layer insulation layer 32 that has been etched and the landing plugs 33. Each of the bit lines 37 is formed in a stack structure of a conductive layer 34 and a hard mask 35, and a plurality of spacers 38 are formed over sidewalls of the bit lines 37.

A second inter-layer insulation layer 39 is formed over an entire surface of the above resulting structure until sufficiently filling empty spaces between the bit lines 37. Then, a chemical mechanical polishing (CMP) process is performed to planarize the second inter-layer insulation layer 39. The second inter-layer insulation layer 39 includes the same material as the first inter-layer insulation layer 32.

Figure 3B:
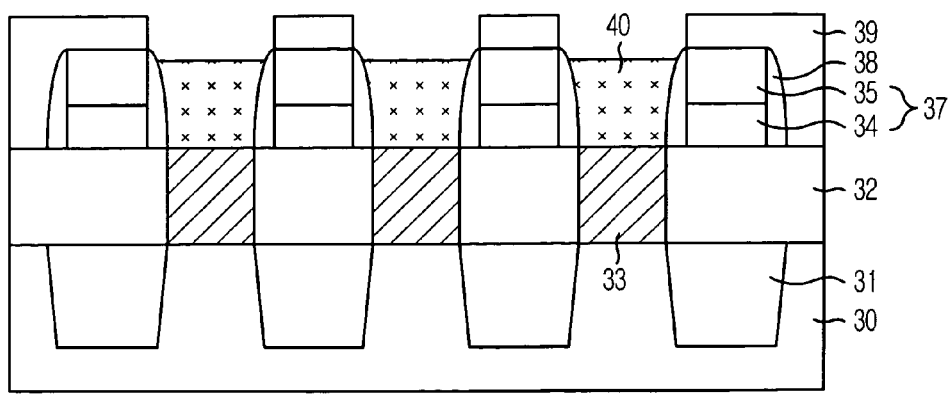

As shown in FIG. 3B, predetermined portions of the second inter-layer insulation layer 39 are etched to form a plurality of storage node contact holes (not shown) exposing top surfaces of the landing plugs 33 existing between the bit lines 37.

A conductive layer for a storage node contact plug is formed until completely filling the storage node contact holes. The conductive layer includes polysilicon or tungsten.

The conductive layer is planarized to form a plurality of storage node contact plugs 40. The planarization process comprises using an etch back process. The etch back process is performed in a manner to make a height difference between the second inter-layer insulation layer 39 that has been etched and the storage node contact plugs 40. That is, a top surface of the second inter-layer insulation layer 39 that has been etched is higher than top surfaces of the storage node contact plugs 40 by a predetermined thickness.

An etch gas is controlled to maintain etch selectivity between the second inter-layer insulation layer 39 that has been etched and the storage node contact plugs 40 at least in a ratio of approximately 1 part of the second inter-layer insulation layer 39 that has been etched to approximately 3 parts or greater of the storage node contact plugs 40. The storage node contact plugs 40 are etched at least approximately three times greater than the second inter-layer insulation layer 39 that has been etched. As a result, heights of the top surfaces of the individual storage node contact plugs 40 are more reduced by a thickness ranging from approximately 200 Å to approximately 700 Å than that of the top surface of the second inter-layer insulation layer 39 that has been etched. During the etch back process, the etch gas is controlled differently according to a kind of the material used to form the storage node contact plugs 40. For instance, in case of using polysilicon to form the storage node contact plugs 40, a gas mixture of chlorine ($Cl_2$) and hydrogen bromide (HBr) is used as the etch gas, and in case of using tungsten, a gas mixture of sulfur hexafluoride ($SF_6$) and nitrogen ($N_2$) is used as the etch gas.

The etch back process is performed using one selected from a group consisting of a reactive ion beam etching (RIE) type apparatus, a magnetically enhanced reactive ion beam etching (MERIE) type apparatus, both using a mono radio frequency (RF) power source, a transformer coupled plasma (TCP) type apparatus and a capacitance coupled plasma (CCP) type apparatus, both using a dual RF power source.

In addition to the controlling the etch gas to produce the height difference between the second inter-layer insulation layer 39 that has been etched and the storage node contact plugs, a separate recess process can be performed to recess the storage node contact plugs 40 to a predetermined thickness. In case of using the recess process, the conductive layer is planarized through performing a planarization process which only planarizes the conductive layer and then, the separate recess process is performed to recess the storage node contact plugs 40.

Figure 3C:
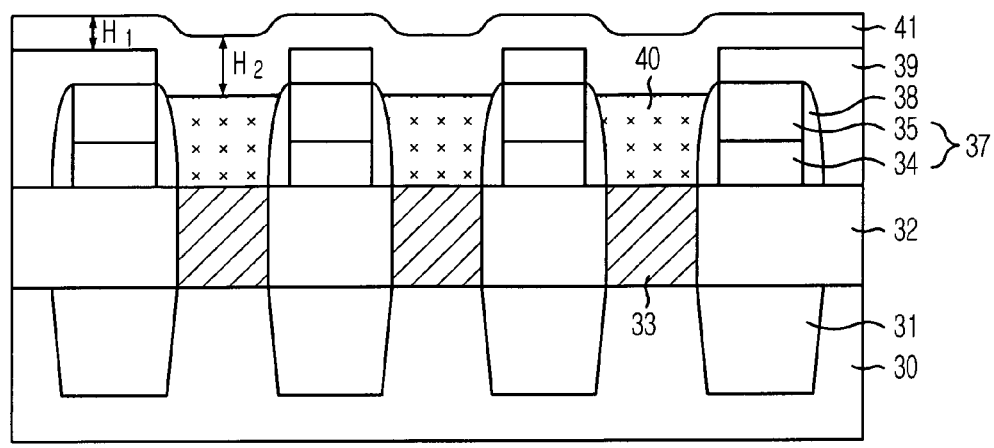

As shown in FIG. 3C, an etch stop layer 41 is formed over the above resulting structure including the second inter-layer insulation layer 39 that has been etched and the storage node contact plugs 40 having the height difference therebetween. The etch stop layer 41 includes a nitride-based material.

Particularly, the etch stop layer 41 is formed with an unequal thickness over the top surface of the second inter-layer insulation layer 39 that has been etched and the top surfaces of the storage node contact plugs 40. For instance, a height $H_1$ of the etch stop layer 41 formed over the top surface of the second inter-layer insulation layer 39 that has been etched is smaller than a height $H_2$ of the etch stop layer 41 formed over the top surfaces of the storage node contact plugs 40. The height $H_2$ of the etch stop layer 41 formed over the top surfaces of the storage node contact plugs 40 is greater than the height $H_1$ of the etch stop layer 41 formed over the top surface of the second inter-layer insulation layer 39 that has been etched by approximately 100 Å to approximately 300 Å. Accordingly, a thickness margin of the etch stop layer 41 over the top surfaces of the storage node contact plugs 40 can be sufficiently secured.

Particularly, the height difference ($H_2$—$H_1$) between the etch stop layer 41 formed over the top surface of the second inter-layer insulation layer 39 that has been etched and that formed over the storage node contact plugs 40 ranges from approximately 100 Å to approximately 300 Å. If the height difference ($H_2$—$H_1$) between the etch stop layer 41 formed over the top surface of the second inter-layer insulation layer 39 that has been etched and that formed over the storage node contact plugs 40 is approximately 100 Å or smaller, the etch stop layer 41 can be punched in consideration of uniformity within a wafer. If the height difference ($H_2$—$H_1$) between the etch stop layer 41 formed over the top surface of the second inter-layer insulation layer 39 that has been etched and that formed over the storage node contact plugs 40 is approximately 300 Å or greater, a thickness of a third inter-layer insulation layer which is an inter-layer insulation layer for forming a capacitor may be damaged and a distance between capacitors are reduced due to an increased etching period during removing the etch stop layer 41.

When forming the etch stop layer 41, a low pressure chemical vapor deposition (LPCVD) method having an excellent step coverage property is used. Through using the LPCVD method, the thickness of the etch stop layer 41 formed over the storage node contact plugs 40 can be thicker than that of the etch stop layer 41 formed over the second inter-layer insulation layer 39 that has been etched.

Figure 3D:
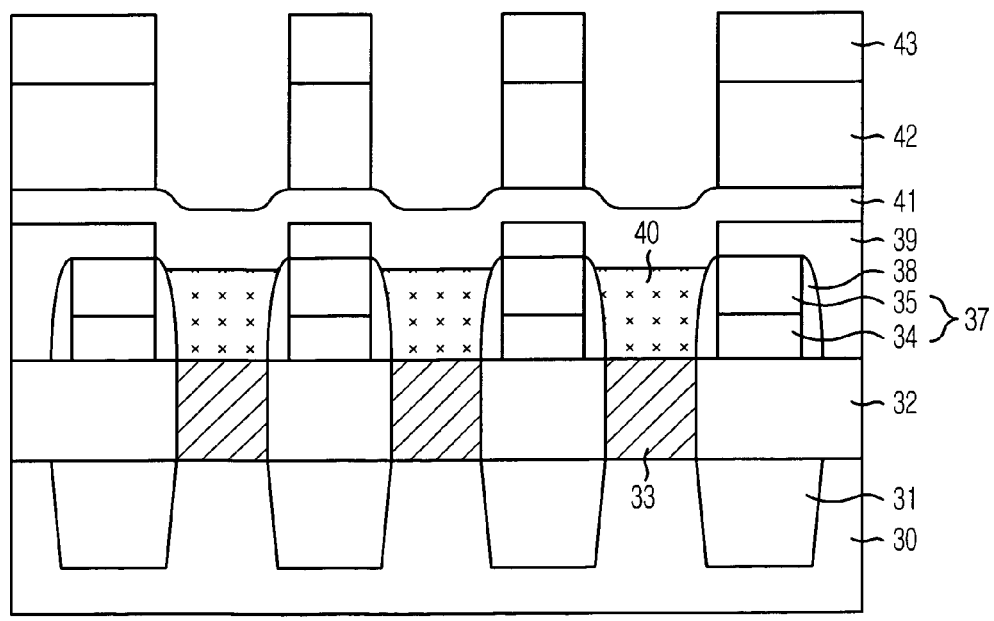

As shown in FIG. 3D, a third inter-layer insulation layer 42 is formed over the etch stop layer 41 and then, a hard mask material (not shown) is formed over the third inter-layer insulation layer 42. The third inter-layer insulation layer includes the same oxide-based material as the first inter-layer insulation layer 32.

A separate photoresist pattern (not shown) is formed over an entire surface of the resulting structure and afterwards, an etching process is performed by using the photoresist pattern to etch the hard mask material. As a result, a hard mask pattern 43 is formed. The hard mask pattern 43 includes the same material as the storage node contact plugs 40. For instance, the hard mask pattern 43 includes one of polysilicon and tungsten. Also, the hard mask pattern 43 can include a different material from the storage node contact plugs 40 (e.g., a nitride layer).

As an aspect ratio is gradually increased in fabricating a semiconductor device, a lower structure to be patterned, (i.e., the third inter-layer insulation layer 42) may not be normally etched only using the photoresist layer having a thickness that is not sufficient for patterning the lower structure. Accordingly, the hard mask pattern 43 is required to secure a thickness margin of a mask used during the etching process.

The third inter-layer insulation layer 42 is etched performing the etching process using the hard mask pattern 43 as a mask to form a storage node pattern which becomes a bottom electrode of a capacitor. The etching is stopped at an upper portion of the etch stop layer 41 having different etch selectivity from the third inter-layer insulation layer 42 that has been etched.

A stripping process is performed to remove the photoresist pattern.

Figure 3E:
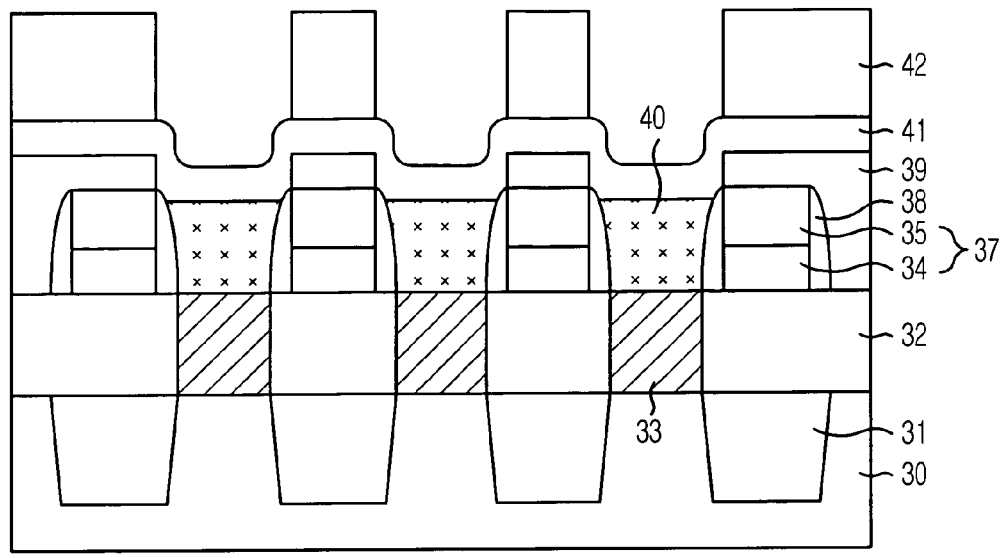

As shown in FIG. 3E, a separate etching process is performed to remove the hard mask pattern 43 (see FIG. 3D).

Since the thickness of the etch stop layer formed over the storage node contact plugs is generally small, the storage node contact plugs are exposed when the etch stop layer is removed simultaneous to the removal of the hard mask pattern. As a result, the exposed surfaces of the storage node contact plugs are damaged by an etching solution used to remove the hard mask pattern. Particularly, in the case of forming the hard mask pattern using the same material as the storage node contact plugs, the exposed surfaces of the storage node contact plugs may be greatly damaged by the etching solution used to remove the hard mask pattern.

According to this embodiment of the present invention, the thickness margin of the etch stop layer 41 formed over the storage node contact plugs 40 is sufficiently secured not to remove the predetermined portion of the etch stop layer 41 during removing the hard mask pattern 43. Thus, the storage node contact plugs 41 are not exposed. Accordingly, although the hard mask pattern 43 is removed, the predetermined thickness of the etch stop layer 41 remains over the storage node contact plugs 40 and thus, the surfaces of the storage node contact plugs 40 can be prevented from the damage caused during removing the hard mask pattern 43 in advance.

Particularly, although the hard mask pattern 43 includes the same material as the storage node contact plugs 40, the etch stop layer 41 can remain over the storage node contact plugs 40 during removing the hard mask pattern 43. Thus, the damage caused on the surfaces of the storage node contact plugs 40 can be reduced. As a result, reliability of the DRAM device and yields of products can be improved.

In the case of forming the hard mask pattern 43 using the nitride layer which is a different material from the storage node contact plugs 40, the etch stop layer 41 can secure the sufficient thickness during removing the hard mask pattern 43. Although the hard mask pattern 43 is removed, the predetermined thickness of the etch stop layer 41 can remain. Accordingly, the storage node contact plugs 40 cannot be directly exposed due to the removal of the hard mask pattern 43 and the surfaces of the storage node contact plugs 40 cannot be damaged during removing the hard mask pattern 43.

Figure 3F:
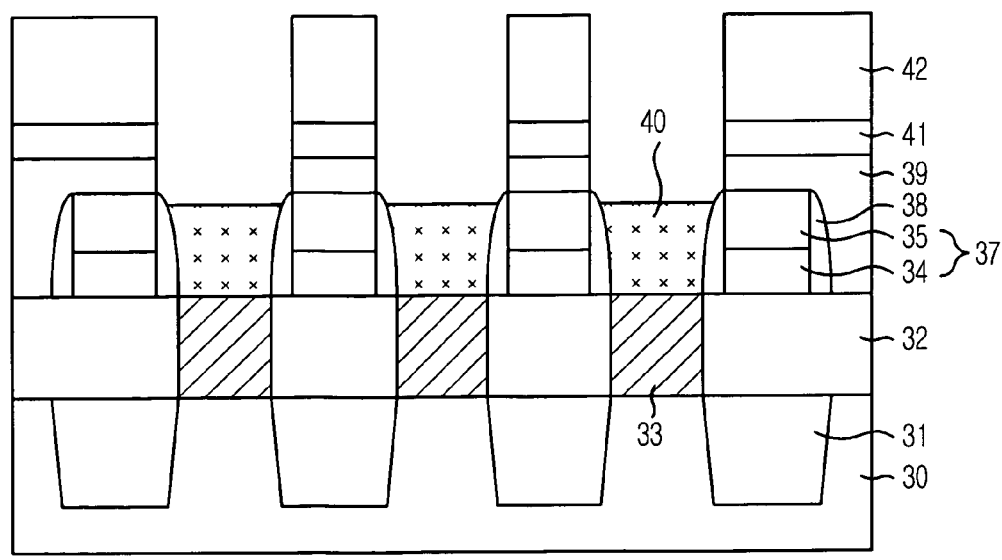

As shown in FIG. 3F, an etching process is performed to remove the etch stop layer 41 remaining over the storage node contact plugs 40. As a result, a plurality of contact holes (not shown) exposing the surfaces of the storage node contact plugs 40 are formed.

Hereinafter, a capacitor formation process is performed to form a bottom electrode, a dielectric layer, and a top electrode of the capacitor over the third inter-layer insulation layer 42 including the contact holes (not shown).

Figure 4:
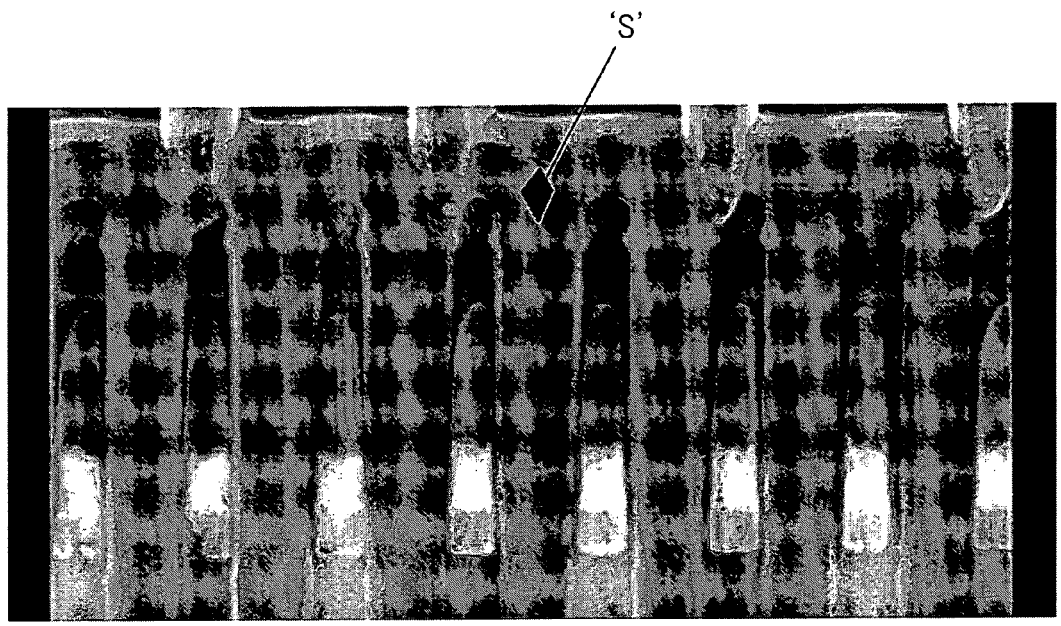
FIG. 4 is a TEM micrograph illustrating a height difference between surfaces of storage node contact plugs caused after performing an etch back process as shown in FIG. 3B.

FIG. 4 is a transmission electron microscopy (TEM) micrograph illustrating a height difference between surfaces of storage node contact plugs caused after performing an etch back process as shown in FIG. 3B.

The etch back process is performed in a manner to produce the height difference denoted with 'S' between the storage node contact plugs 40 (see FIG. 3B) and the second inter-layer insulation layer 39 that has been etched (see FIG. 3B).

Figure 5:
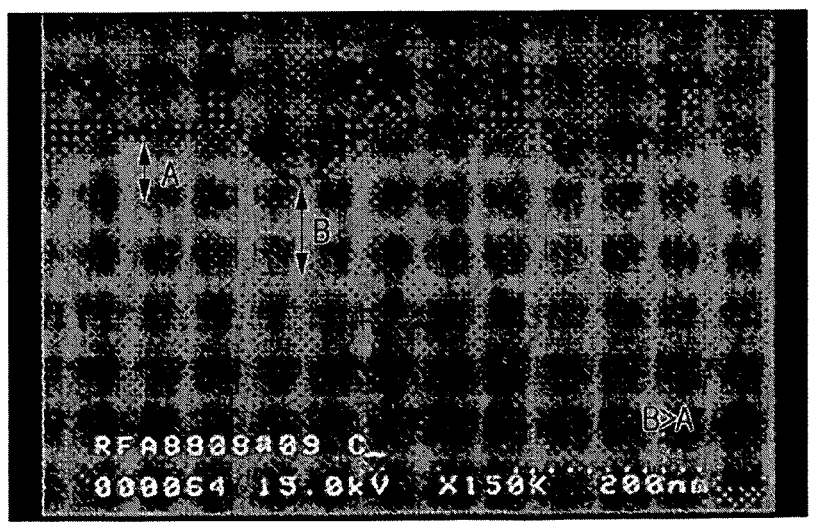
FIG. 5 is a TEM micrograph illustrating an etch stop layer formed with an unequal thickness as shown in FIG. 3C.

FIG. 5 is a TEM micrograph illustrating an etch stop layer formed with an unequal thickness as shown in FIG. 3C.

A thickness B of the etch stop layer 41 (see FIG. 3C) formed over the storage node contact plugs 40 (see FIG. 3C) is greater than a thickness A of the etch stop layer 41 (see FIG. 3C) formed over the second inter-layer insulation layer 39 that has been etched (see FIG. 3C).

According to this embodiment of the present invention, a thickness margin of the etch stop layer formed over the storage node contact plugs is sufficient so as not to remove the etch stop layer formed over the storage node contact plugs during removing the hard mask pattern. As a result, the predetermined thickness of the etch stop layer remains and the surfaces of the storage node contact plugs cannot be damaged during removing the hard mask pattern. Also, reliability of the device and yields of the products can be improved.

The present application contains subject matter related to the Korean patent application No. KR 2006-0038995, filed in the Korean Patent Office on Apr. 28, 2006, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:

forming a first inter-layer insulation layer over a substrate where a plurality of first contact holes are formed;

forming a conductive layer over the first inter-layer insulation layer to fill the first contact holes;

forming a conductive layer for a storage node contact plug such that a storage node contact hole, which is formed by etching a portion of a second inter-layer insulation layer formed over the first inter-layer insulation layer, is filled;

planarizing the conductive layer for the storage node contact plug to have a surface thickness difference between the second inter-layer insulation layer and the storage node contact plug; and forming an etch stop layer more thickly over the surfaces of the storage node contact plug than the surface of the second inter-layer insulation layer.

2. The method of claim 1, wherein the forming of the etch stop layer includes:

forming a third inter-layer insulation layer over the etch stop layer;

forming a hard mask pattern over the third inter-layer insulation layer;

etching the third inter-layer insulation layer using the hard mask pattern to form a plurality of second contact holes exposing the etch stop layer;

removing the hard mask pattern; and removing the etch stop layer remaining over the contact plugs to expose the contact plugs.

3. The method of claim 2, wherein the forming of the contact plugs comprises performing an etch back process.

4. The method of claim 3, wherein the etch back process is performed such that the surface of the first inter-layer insulation layer is higher than the surfaces of the contact plugs by a thickness ranging from approximately 200 Å to approximately 700 Å.

5. The method of claim 4, wherein the etch back process is performed controlling an etch gas to make an etch rate of the contact plugs at least approximately three times greater than that of the first inter-layer insulation layer.

6. The method of claim 5, wherein if the contact plugs include polysilicon, the etch gas comprises a gas mixture of chlorine ($Cl_2$) and hydrogen bromide (HBr).

7. The method of claim 5, wherein if the contact plugs include tungsten, the etch gas comprises a gas mixture of sulfur hexafluoride ($SF_6$) and nitrogen ($N_2$).

8. The method of claim 5, wherein the etch back process comprises performing the etch back process using one of a reactive ion beam etching (RIE) type apparatus, a magnetically enhanced reactive ion beam etching (MERIE) type apparatus, a transformer coupled plasma (TCP) type apparatus and a capacitance coupled plasma (CCP) type apparatus.

9. The method of claim 2, wherein the etch stop layer is formed using a low pressure chemical vapor deposition (LPCVD) method.

10. The method of claim 9, wherein a thickness of the etch stop layer formed over the contact plugs is greater than that of the etch stop layer formed over the first inter-layer insulation layer by approximately 100 Å to approximately 300 Å.

11. The method of claim 2, wherein the hard mask pattern includes one selected from a polysilicon layer, a tungsten layer and a nitride layer.

12. A method for fabricating a semiconductor device, comprising:

providing a substrate where word lines, landing plugs and bit lines are formed;

forming a first inter-layer insulation layer to cover the bit lines;

etching the first inter-layer insulation layer to expose top surfaces of the landing plugs to form a plurality of first contact holes;

forming a conductive layer over the first inter-layer insulation layer to fill the first contact holes;

etching the conductive layer such that a top surface of the first inter-layer insulation layer is higher than that of the conductive layer, whereby a plurality of storage node contact plugs filling the first contact holes are formed;

forming an etch stop layer with a greater thickness over the first inter-layer insulation layer than over the storage node contact plugs;

forming a second inter-layer insulation layer over the etch stop layer;

forming a hard mask pattern over the second inter-layer insulation layer;

etching the second inter-layer insulation layer through performing an etching process using the hard mask pattern to form a plurality of second contact holes exposing the etch stop layer;

removing the hard mask pattern;

removing the etch stop layer remaining over the storage node contact plugs to expose the storage node contact plugs; and forming a storage node over a height difference produced by the forming of the second contact holes.

13. The method of claim 12, wherein the forming of the storage node contact plugs comprises forming an etch back process such that the top surface of the first inter-layer insulation layer is higher than the top surfaces of the storage node contact plugs by approximately 200 Å to approximately 700 Å.

14. The method of claim 13, wherein the etch back process is performed controlling an etch gas to make an etch rate of the contact plugs at least approximately three times greater than that of the first inter-layer insulation layer.

15. The method of claim 14, wherein if the contact plugs include polysilicon, the etch gas comprises a gas mixture of chlorine ($Cl_2$) and hydrogen bromide (HBr).

16. The method of claim 14, wherein if the contact plugs include tungsten, the etch gas comprises a gas mixture of sulfur hexafluoride ($SF_6$) and nitrogen ($N_2$).

17. The method of claim 14, wherein a thickness of the etch stop layer over the storage node contact plugs is greater than that of the etch stop layer over the first inter-layer insulation layer by approximately 100 Å to approximately 300 Å.

18. The method of claim 17, wherein the hard mask pattern includes one selected from a polysilicon layer, a tungsten layer and a nitride layer.

* * * * *

UNITED STATES PATENT AND TRADEMARK OFFICE
CERTIFICATE OF CORRECTION

PATENT NO. : 7,435,677 B2 Page 1 of 1
APPLICATION NO. : 11/595440
DATED : October 14, 2008
INVENTOR(S) : Choi It is certified that error appears in the above-identified patent and that said Letters Patent is hereby corrected as shown below:

In column 3, line 15, please delete "greater" and insert -- smaller --.

In Claim 12, column 9, line 7, please delete "greater" and insert -- smaller --.

Signed and Sealed this

Second Day of June, 2009

JOHN DOLL
*Acting Director of the United States Patent and Trademark Office*